United States Patent
Koezuka et al.

(10) Patent No.: US 7,504,325 B2
(45) Date of Patent: Mar. 17, 2009

(54) LASER DOPING PROCESSING METHOD AND METHOD FOR MANUFACTURING SEMICONDUCTOR DEVICE

(75) Inventors: Junichi Koezuka, Kanagawa (JP); Sadako Takada, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 811 days.

(21) Appl. No.: 10/700,571

(22) Filed: Nov. 5, 2003

(65) Prior Publication Data
US 2005/0003594 A1    Jan. 6, 2005

(30) Foreign Application Priority Data
Nov. 5, 2002    (JP) .............. 2002-321619

(51) Int. Cl.
*H01L 21/20* (2006.01)
*H01L 21/36* (2006.01)

(52) U.S. Cl. ................................... 438/486
(58) Field of Classification Search .............. 438/486, 438/308, 166, 151, 146, 482; 257/347, 288, 257/72, 66, 64, 59; 222/56; 117/82
See application file for complete search history.

(56) References Cited

U.S. PATENT DOCUMENTS

| | | | |
|---|---|---|---|
| 3,520,810 A * | 7/1970 | Plaskett et al. ............... 117/82 |
| 4,676,404 A * | 6/1987 | Yamazaki et al. ............. 222/56 |
| 5,696,011 A * | 12/1997 | Yamazaki et al. ........... 438/166 |
| 6,020,223 A | 2/2000 | Mei et al. |
| 6,355,509 B1 | 3/2002 | Yamazaki |
| 6,358,784 B1 | 3/2002 | Zhang et al. |
| 6,586,318 B1 | 7/2003 | Lu et al. |

FOREIGN PATENT DOCUMENTS

| | | |
|---|---|---|
| JP | 5-275452 | 10/1993 |
| JP | 05-326420 | 12/1993 |
| JP | 5-326430 | 12/1993 |
| JP | 6-302531 | 10/1994 |
| JP | 10-214786 | 8/1998 |
| JP | 10214786 A * | 8/1998 |
| JP | 11-135802 | 5/1999 |
| JP | 2001-223174 | 8/2001 |

* cited by examiner

*Primary Examiner*—Evan Pert
*Assistant Examiner*—Monica D Harrison
(74) *Attorney, Agent, or Firm*—Nixon Peabody LLP; Jeffrey L. Costellia (57) ABSTRACT

It is an object of the present invention to provide an easy doping method where concentration control is easy, where doping with respect to a large area can be practically conducted and which does not require a special device. The present invention provides a laser doping method where a liquid including a dopant is applied to the surface of a semiconductor that is to be doped and the surface of the semiconductor is irradiated with laser light to add the dopant to the semiconductor. It is also possible to conduct crystallization at the same time.

11 Claims, 5 Drawing Sheets

▨▨▨ TRANSPARENT CONDUCTIVE FILM

▨▨▨ WIRING

▨▨▨ TRANSPARENT CONDUCTIVE FILM

LASER DOPING PROCESSING METHOD AND METHOD FOR MANUFACTURING SEMICONDUCTOR DEVICE

BACKGROUND OF THE INVENTION

1. Field of the Invention

The present invention relates to a method of doping a semiconductor with an impurity. In particular, the present invention relates to channel doping, where precise control of the added amount of an impurity with which a semiconductor is to be doped is necessary, and to a laser doping method where an impurity is added to a semiconductor by irradiating the semiconductor with laser light.

2. Description of the Related Art

When a semiconductor device is fabricated using the electrical characteristics of a semiconductor, a technique called doping, where a minute amount of an impurity is added to a semiconductor in order to control the electrical characteristics thereof, is at present widely used. Methods of doping semiconductors can be broadly divided into two kinds: methods where the impurity is added in the process of forming the semiconductor from raw materials, and methods where the impurity is added after the semiconductor has been formed. Examples of methods where the impurity is added after the semiconductor has been formed representatively include ion implantation, plasma doping and laser doping.

Ion implantation is a method where a gas including a dopant is added to a plasma chamber to draw out ion beams, and desired dopant ions are accelerated in a mass separator with an energy of several keV to several hundred keV and caused to impact the surface of the semiconductor to physically add the dopant. Plasma doping is a method where doping is conducted by exposing the semiconductor to plasma included a dopant gas diluted to a desired concentration or by exposing the semiconductor to ions drawn out from the plasma. Because mass separation is not conducted in plasma doping, the semiconductor is doped with various forms of ions generated in the plasma.

Laser doping is also used as one form of doping. Laser doping is a method where the semiconductor is disposed in a gas including a dopant and the surface of the semiconductor is irradiated with laser light, whereby the semiconductor is melted, and the dopant is added and activated. Although wide-range doping and high activation are possible with laser doping, in order to further raise the efficiency of laser doping, research is also being conducted with respect to heating samples or irradiating the samples with a laser while imparting magnetic energy thereto (e.g., see Patent Document 1).

In the world of semiconductors, advances with respect to increasing speed and miniaturization are being made at a fast pace. In accompaniment therewith, there is a strong demand to improve the semiconductors themselves and to improve circuit reliability. Although the threshold voltage is often used as a parameter to evaluate semiconductor devices, the threshold voltage lacks reliability if it is too high or too low, and the most important thing is being able to obtain a desired threshold voltage.

A technique called channel doping is used as a means for controlling the threshold voltage. As the name implies, channel doping is a technique where an infinitesimal amount of an impurity is added to a portion serving as a channel forming region so that a desired threshold voltage can be obtained. Because the purpose of channel doping is to precisely control changes in the threshold voltage, it is necessary to precisely control the added amount of the impurity.

The amount of ions implanted in ion implantation or plasma doping is controlled using a Faraday Cup Electrometer, which measures flowing ions as a current. Ion implantation, which can dope the semiconductor with just the necessary type of ions, can be suitably used in channel doping where precise concentration control is necessary.

In order to realize an increase in speed and miniaturization, it is also necessary to shorten the gate length. However, this is a problem because, when the gate length is shortened, the so-called short channel effect arises where the current leaks at the deep portion of the channel forming region. In order to prevent this, it is effective to add the impurity only to extremely shallow portions of the source region and the drain region (to form shallow junctions).

As a technique for forming a crystalline semiconductor layer with respect to a substrate with low thermal resistance, such as a glass substrate, there is a technique that uses elements represented by Ni which promote crystallization. This is a technique where crystallization is conducted at a low temperature and in a short amount of time by forming amorphous silicon on a glass substrate, forming a thin film of Ni by sputtering or applying a solution including Ni with a spinner, and conducting crystallization. By using an inexpensive glass substrate, this technique is important in lowering the cost of the product.

[Patent Document 1]

JP-A-5-326430

The present state of affairs is one where there are problems with doping in that the sizes of substrates flowing through the fabrication process are becoming larger and the regions where doping is necessary are expanding in accompaniment with circuits that are becoming more integrated and displays that are becoming larger year after year.

In ion implantation, in order to accurately mass-separate the ion beams, it is necessary to narrow the beams. For this reason, there are grave problems in that ion implantation cannot accommodate wide-range doping because doping cannot be conducted at one time over a wide range, and an enormous amount of time is required for processing in order to dope a large area.

With ion implantation, there is also the problem that it is necessary to implant ions with a low energy in order to form shallow junctions, but low-energy ion beams end up being emitted and it is difficult to obtain a sufficient current amount. It is also extremely difficult to add the impurity to only the extremely shallow regions because the dopant ends up being diffused due to thermal annealing for recovering damage resulting from the ion implantation.

Plasma doping is more effective than ion implantation in terms of processing time, but because mass separation is not conducted, the ion current measured by a Faraday Cup Electrometer is the total ion current where the ions of the gas diluting the dopant gas are added to the dopant ions. Thus, even if the total ion dopant amount is precisely controlled, the amount of the implanted dopant also ends up changing when the ratio of the gas diluting the dopant gas to the dopant gas, i.e., the ion ratio, changes during device operation. For this reason, there is a problem in applying plasma doping to channel doping, where precise concentration control is necessary.

With respect to laser doping, in methods that are often conducted where the semiconductor is irradiated with laser light in a dopant gas atmosphere, controlling the amount of the dopant to be implanted is difficult and a special device is required in order to uniformly distribute the dopant.

An other problem is that, although elements that promote crystallization have an extremely effective function in relation to crystallization, when these elements remain in large amounts in the semiconductor layer after crystallization, they have an adverse affect on TFT characteristics when a TFT—and particularly a TFT channel region—is made using the semiconductor layer. For this reason, when crystallization is conducted using elements that promote crystallization, it is common for means called gettering, which reduces the concentration of such elements, to be taken.

Gettering is conducted by moving, to another region (called a gettering region), the elements that promote crystallization from regions where it is a problem for those elements to remain.

In relation to removing the remaining element Ni, a method according to gettering (JP-A-10-214786) has been disclosed by the present applicant; however, a mask forming step for selectively adding the Ni element and a mask forming step for selectively adding a gettering element are necessary, and there is the problem of increasing steps, such as there being the necessity of having to twice conduct heating in the crystallization step and the gettering step, which causes productivity and costs to deteriorate.

SUMMARY OF THE INVENTION

In light of these problems, it is an object of the present invention to provide an easy doping method where concentration control is easy, where doping with respect to a large area can be practically conducted and which does not require a special device.

It is also an object of the invention to provide a doping method where concentration control in a depth direction that can accommodate shallow junctions can be easily conducted.

It is also an object of the invention to provide a gettering method that does not cause productivity and costs to deteriorate. Thus, the present invention provides a laser doping method where a liquid including a dopant (impurity of a conductivity type whose purpose is to control valence electrons) is applied to the surface of a semiconductor that is to be doped and the surface of the semiconductor is irradiated with laser light to add the dopant to the semiconductor.

With this method, the concentration of the dopant in the liquid including the dopant is adjusted in order to supply the dopant with the liquid, whereby the concentration of the dopant added to the semiconductor can be easily controlled. For this reason, control of the concentration of the dopant, which is necessary in order to control the threshold voltage, can be suitably conducted.

Also, with the laser doping, the portion irradiated with the laser melts and the dopant is incorporated therein. For this reason, it becomes possible to easily adjust the depth to which the dopant is added because the depth of the melted semiconductor can be adjusted by adjusting the energy imparted by the laser light. For this reason, it also becomes easy to form shallow junctions.

The present invention provides a semiconductor device fabrication method including: applying a liquid including a dopant to an amorphous semiconductor layer formed on a substrate including an insulating surface; and crystallizing the amorphous semiconductor layer by irradiating the amorphous semiconductor layer with laser light to form a crystalline semiconductor layer, and at the same time adding the dopant to the crystalline semiconductor layer.

Due to this configuration, crystallization with the laser light and the addition of the dopant can be simultaneously conducted, so that a reduction of steps and improvement of throughput accompanying this can be expected.

The present invention also provides a semiconductor device fabrication method including: applying a liquid including a dopant and an element that promotes crystallization to an amorphous semiconductor layer formed on a substrate including an insulating surface; and crystallizing the amorphous semiconductor layer by irradiating the amorphous semiconductor layer with laser light to form a crystalline semiconductor layer, and at the same time adding the dopant to the crystalline semiconductor layer.

Due to this configuration, the element that promotes crystallization can be simultaneously added with the dopant, and a crystalline semiconductor layer with excellent crystallinity can be obtained. Thus, the dopant can be added at the same time as the crystallization, so that a reduction of steps and improvement of throughput this can be expected.

Moreover, the present invention provides a semiconductor device fabrication method including: applying a liquid including an element that promotes crystallization to an amorphous semiconductor layer formed on a substrate including an insulating surface; crystallizing the amorphous semiconductor layer by heating the amorphous semiconductor layer to form a crystalline semiconductor film; applying a liquid including a dopant to the crystalline semiconductor layer; and adding the dopant to the crystalline semiconductor layer by irradiating the crystalline semiconductor layer with laser light.

Due to this configuration, the dopant can be added to the semiconductor at the same time as laser annealing following heat crystallization using the element that promotes crystallization, which leads to a reduction of steps.

Also, in the present invention, the element that promotes crystallization remains in a high concentration in the semiconductor layer that is crystallized using the element that promotes crystallization. When the liquid including the dopant is applied to the semiconductor layer and the semiconductor layer is irradiated with laser light, the semiconductor layer melts and the dopant is incorporated therein, but hardening begins from the substrate side because the heat imparted by the irradiation with the laser light is diffused from the substrate side. When this happens, the concentration of the dopant is segregated so that it becomes higher away from the substrate, i.e., closer to the surface of the semiconductor layer. Because the element that promotes crystallization easily moves to where the concentration of the impurity is high, the concentration of the element that promotes crystallization is also segregated so that it similarly becomes higher towards the surface. The invention is characterized in that gettering is conducted by removing, with etching or chemical mechanical polishing (CMP), the portion where the concentration of the element promoting crystallization and the concentration of the dopant are both high.

Due to this configuration, gettering can be completed simply by adding an etching or CMP step to the doping step without using gettering where the number of steps greatly increases, and a crystalline semiconductor layer with which can be made a TFT with excellent characteristics can be fabricated.

The present invention, which takes the above configurations, has the effects that the concentration of the added dopant can be more precisely controlled without requiring a special device, control of the depth to which the dopant is added becomes easy, and throughput is improved due to a reduction of steps.

DETAILED DESCRIPTION OF THE INVENTION

Embodiment 1

In the present embodiment, a method of doping a semiconductor by applying thereto a liquid including a dopant and irradiating the semiconductor with laser light will be described.

A liquid including a dopant is applied with a spinner to the surface of a semiconductor to form a thin film of the liquid including the dopant. An element that creates an N-type or a P-type is used as the dopant. Representative examples of the N-type include phosphor, arsenic and antimony, and representative examples of the P-type include boron, aluminium and gallium. The concentration of the dopant in the liquid is adjusted so that a desired concentration is eventually added to the semiconductor film.

Examples of the solution liquid including the element that creates the P-type or the N-type representatively include an aqueous solution of boric acid or phosphoric acid. When these aqueous solutions are applied to the surface of the semiconductor, the wettability between the semiconductor surface and water is not very good. Thus, in order to improve wettability, an extremely thin oxide film may first be formed by applying ozone water to the surface of the semiconductor film. Also, the element creating the P-type or the N-type is not limited to these. Other elements can be used as long as they can be appropriately dissolved in a solvent and applied and as long as they do not exert an enormous influence on the characteristics of the semiconductor. Also, the solvent is not limited to water. An organic solvent or the like can also be used in accordance with the element creating the P-type or the N-type. For example, benzene, toluene, xylene, carbon tetrachloride, chloroform, ether and ethanol can be used. In this case, it is not necessary to form the oxide film on the semiconductor film surface. Moreover, the applied liquid is not limited to a solvent and may be a homogenous dispersion or a colloidal solution.

After the liquid including the dopant is applied, the semiconductor film is irradiated with laser light and doping is conducted. For the laser light, a pulse oscillation type or continuous oscillation type gas laser, solid-state laser or metal laser can be used. When these lasers are used, a method may be used where the laser light emitted from the laser oscillator is linearly condensed with an optical system to irradiate the semiconductor film.

Due to this laser irradiation, all or part of the semiconductor is melted and the dopant is incorporated therein, whereby the dopant is added to the semiconductor layer.

By conducting laser doping in this manner, effects can be obtained, such as being able to precisely add a desired concentration of the impurity to the semiconductor and being able to obtain with good throughput a highly reliable TFT even with a large-area substrate.

Embodiment 2

In the present embodiment, a method where crystallization and laser doping are simultaneously conducted will be described using FIG. 1.

First, base insulating films 101a and 101b are formed on a substrate 100. For the substrate, an insulating substrate such as a glass substrate, a quartz substrate, crystalline glass, or a ceramic substrate, a stainless steel substrate, a metal substrate (tantalum, tungsten, molybdenum, etc.), a semiconductor substrate, or a plastic substrate (polyimide, acrylic, polyethylene terephthalate, polycarbonate, polyarylate, polyethersulfone, etc.) can be used. A substrate that is suitable in consideration of the high temperature of the process and purpose may be selected from among these.

The base insulating films 101a and 101b are formed by forming a single layer or two or more plural layers of insulating films such as a silicon oxide film, a silicon nitride film or a silicon oxide nitride film. These are formed using a known method such as sputtering, low pressure CVD or plasma CVD. In the present embodiment, a two-layer laminate structure is formed, but of course one layer or three or more plural layers are also fine.

Next, an amorphous semiconductor film 102 is formed. The amorphous semiconductor film 102 is formed to a thickness of 25 to 80 nm (preferably 30 to 60 nm) with silicon or a material having silicon as a main component (e.g., $Si_xGe_{1-x}$, etc.). As the fabrication method, a well known method such as sputtering, low pressure CVD or plasma CVD can be used. In the present embodiment, the semiconductor film 102 was formed at a film thickness of 50 nm by amorphous silicon. (FIG. 1(A))

Figure 1A:
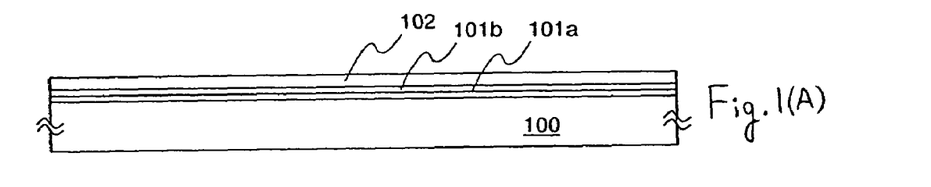
FIG. 1 are diagrams showing an example of an implementation of the invention.
Figure 1B:
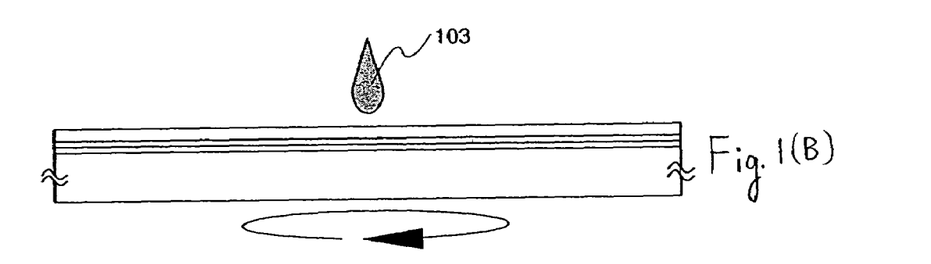
Figure 1C:
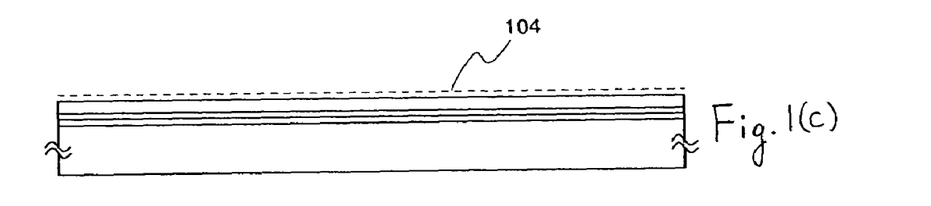

Next, a liquid 103 including a dopant (FIG. 1(B)) is applied with a spinner to form on the amorphous semiconductor film surface a thin film 104 of the liquid including the dopant (FIG. 1(C)). An element that creates an N-type or a P-type is used as the dopant. Representative examples of these include phosphor and boron (in the present embodiment, boron (B) is used in a boric acid aqueous solution). In this case, in order to uniformly apply the liquid to the surface of the amorphous semiconductor film, an extremely thin oxide film (not shown) may be formed by treating the semiconductor film surface with ozone water prior to applying the boric acid aqueous solution.

As for the concentration of the boron, it suffices as long as the boron can be eventually added to the semiconductor film to the extent that a desired threshold voltage can be obtained. The concentration is adjusted so that a concentration of $1\times10^{15}$ to $1\times10^{18}$ atoms/cm$^3$ (representatively, $5\times10^{16}$ to $5\times10^{17}$ atoms/cm$^3$) is added.

Figure 1D:
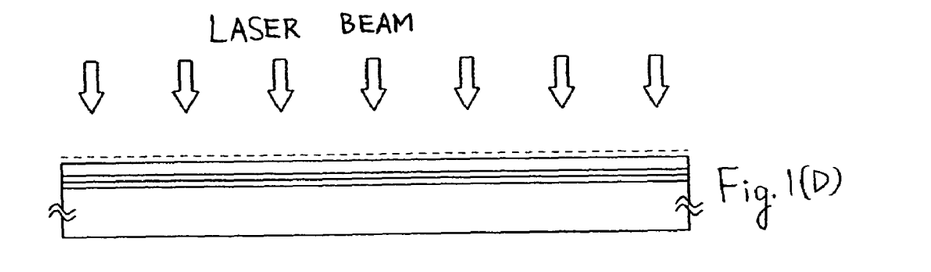
Figure 1E:
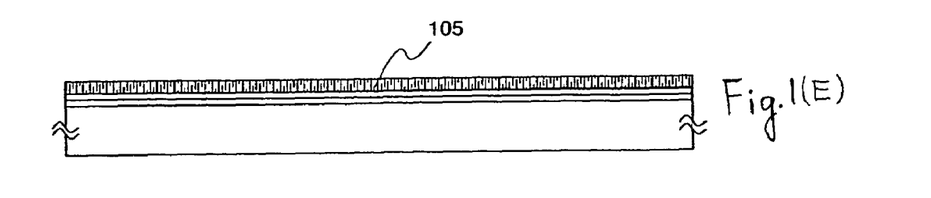

After the boric acid aqueous solution 104 is formed, the semiconductor film is irradiated with laser light so that crystallization is conducted at the same time as doping (FIG. 1(D)). For the laser, a pulse oscillation type or continuous oscillation type gas laser, solid-state laser or metal laser can be used. When these lasers are used, a method may be used where the laser light emitted from the laser oscillator is linearly condensed with an optical system to irradiate the semiconductor film.

Examples of the gas laser include an excimer laser, an Ar laser and a Kr laser. Examples of the solid-state laser include a YAG laser, a YVO$_4$ laser, a YLF laser, a YAlO$_3$ laser, a glass laser, a ruby laser, an alexandrite laser and a Ti:sapphire laser. Examples of the metal laser include a helium cadmium laser, a copper vapor laser and a gold vapor laser. For the solid-state laser, a laser using a crystal such as YAG, YVO$_4$, YLF or YAlO$_3$ doped with Cr$^{3+}$, Cr$^{4+}$, Nd$^{3+}$, Er$^{3+}$, Ce$^{3+}$, Co$^{2+}$, Ti$^{3+}$, Yb$^{3+}$ or V$^{3+}$ is usable. The fundamental wave of the laser will differ depending on the doping material, and laser light having a fundamental wave around 1 μm is obtained. The higher harmonic wave with respect to the fundamental wave can be obtained by using a nonlinear optical element.

The conditions of laser irradiation are appropriately selected by the user. When an excimer laser is used, the pulse oscillation frequency is 300 Hz and the laser energy density is 100 to 400 mJ/cm$^2$ (representatively, 200 to 300 mJ/cm$^2$). When a YAG laser is used, the high-order higher harmonic wave is used so that the pulse oscillation frequency is 30 to 300 kHz, and the laser energy density is 300 to 600 mJ/cm$^2$ (representatively, 350 to 500 mJ/cm$^2$). Additionally, the entire surface of the substrate is irradiated with laser light linearly condensed to a width of 100 to 1000 μm (e.g., 400 μm), and the superpose ratio (overlap ratio) of the linear laser light at this time is 50 to 90%.

Due to this irradiation with laser light, all or part of the amorphous semiconductor layer 102 is melted and the boron is incorporated therein, whereby the boron is added to the amorphous semiconductor layer 102. In the present embodiment, irradiation with the laser light was conducted before the amorphous semiconductor layer 102 was patterned, but application of the liquid and irradiation with the laser light may also be conducted after the amorphous semiconductor layer 102 is patterned into a desired shape. In this manner, a crystalline semiconductor film 105, to which the boron has been introduced, is formed. (FIG. 1(E))

By irradiating the semiconductor film with laser light under appropriate conditions after the boric acid aqueous solution has been applied, crystallization can be conducted at the same time as channel doping and a desired concentration of the impurity can be precisely added to the semiconductor. Also, because channel doping can be conducted at the same time as the crystallization step, it becomes possible to partially shorten the channel doping step, and an improvement in efficiency can be expected. Moreover, by fabricating a TFT where the semiconductor layer serves as a channel forming region, it becomes easy to control the threshold voltage and a highly reliable TFT can be obtained with good throughput even with a large-area substrate.

Embodiment 3

An other embodiment of the invention will be described using, FIG. 1 similar to Embodiment 2.

Similar to Embodiment 2, the base insulating films 101*a* and 101*b* are formed on the substrate 100, and the amorphous semiconductor layer 102 is formed thereon (FIG. 1(A)).

Next, an element that promotes crystallization is simultaneously incorporated, at a weight conversion of 5 to 100 ppm, in the liquid (boric acid aqueous solution) including the dopant (boron) and the liquid is applied to the amorphous semiconductor layer 102 with a spinner. In the present embodiment, nickel acetate corresponding to Ni at a weight conversion of 10 ppm is incorporated in the boric acid aqueous solution, and the thin film 104 of the liquid 103 including the dopant and Ni is formed on the amorphous semiconductor layer 102. Other examples of elements that promote crystallization include iron (Fe), palladium (Pd), tin (Sn), lead (Pb), cobalt (Co), platinum (Pt), copper (Cu) and gold (Au), but one or more of these may be appropriately used. (FIGS. 1(B) and (C))

Next, similar to Embodiment 2, the semiconductor layer is irradiated with laser light. As a result, the catalytic element is diffused through the molten semiconductor layer while forming a silicide, there is the effect of accelerating crystallization of the semiconductor layer in this process, and it becomes possible to form a crystalline semiconductor layer 105 that has a higher crystallinity in comparison to that of Embodiment 2.

The boron is also incorporated in and added to the semiconductor layer during this crystallization due to the semiconductor layer being molten.

In this manner, in the present embodiment, crystallization using an element that promotes crystallization can be conducted at the same time as channel doping. For this reason, using the element that promotes crystallization, channel doping can be conducted during the step of conducting laser crystallization without increasing the number of steps, and it can be expected that efficiency will be greatly improved. Moreover, there are the effects that a desired concentration of the impurity can be precisely added to the crystalline semiconductor layer, and by fabricating a TFT where the crystalline semiconductor layer serves as a channel forming region, it becomes easy to control the threshold voltage and a highly reliable TFT can be obtained with good throughput even with a large-area substrate.

In the present embodiment, crystallization was conducted before the amorphous semiconductor layer 102 was patterned, but application of the liquid and crystallization may also be conducted after the amorphous semiconductor layer 102 is patterned into a desired shape.

Embodiment 4

An other embodiment of the invention will be described using FIG. 2.

Similar to the Embodiment 2 and Embodiment 3, base insulating films 201*a* and 201*b* and an amorphous semiconductor film 202 are formed on a substrate 200. (FIG. 2(A))

Next, crystallization of the amorphous semiconductor film 202 is conducted. In the present embodiment, crystallization by heating using a catalytic element is conducted. A nickel acetate salt solution including Ni at a weight conversion of 10 ppm is applied with a spinner to form a thin film 203 of the nickel solution on the amorphous semiconductor film 202 surface (FIG. 2(B)). A method where the nickel element is dispersed on the entire surface by sputtering may be used instead of coating. Besides nickel (Ni), one or several elements chosen from the elements iron (Fe), palladium (Pd), tin (Sn), lead (Pb), cobalt (Co), platinum (Pt), copper (Cu) or gold (Au) may also be used as the catalytic element.

Next, heating is conducted to crystallize the amorphous semiconductor film 202. Because a catalytic element is used, heating may be conducted for about 4 to 24 hours at 500° to 650°. Due to this crystallization, the amorphous semiconductor film 202 becomes a crystalline semiconductor film 204 (FIG. 2(C)). In the present embodiment, crystallization was conducted with a method resulting from heating using a metal that promotes crystallization, but the crystallization may also be conducted using another known method such as laser crystallization.

Figure 2A:
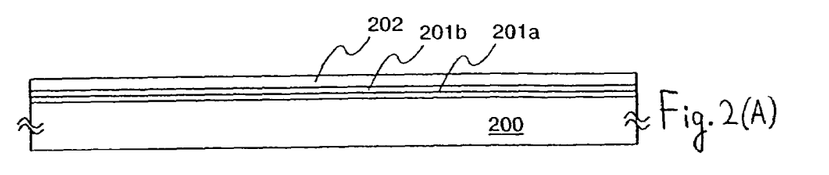
FIG. 2 are diagrams showing an example of an implementation of the invention.
Figure 2B:
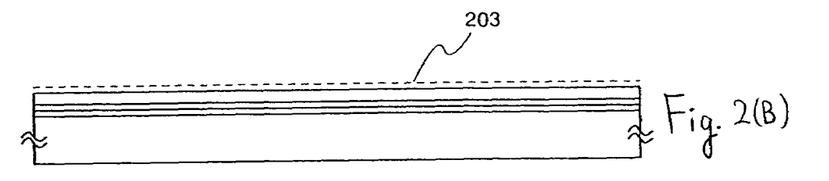
Figure 2C:
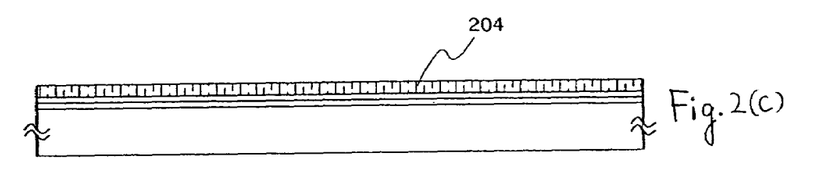
Figure 2D:
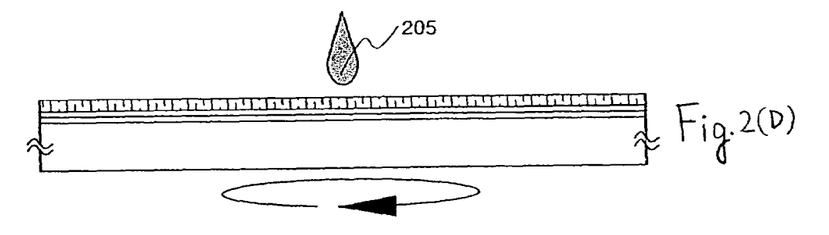
Figure 2E:
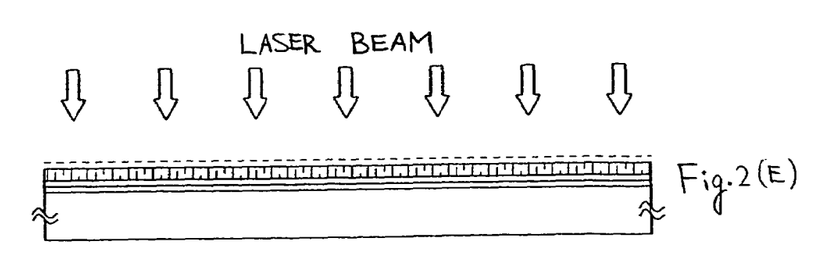

Next, similar to Embodiment 2, a liquid (boric acid aqueous solution) 205 including a dopant is applied (FIG. 2(D)) and the semiconductor is irradiated with laser light. (FIG. 2(E))

Figure 2F:
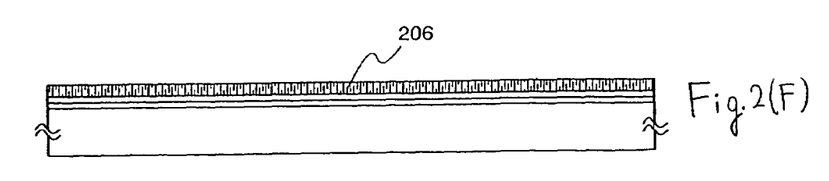

Due to this laser irradiation, the semiconductor film becomes molten, the boron is incorporated therein and the semiconductor layer is again crystallized, whereby it becomes a crystalline semiconductor film 206 to which the dopant has been added (FIG. 2(F)). In the present embodiment, a crystalline semiconductor film that has a higher crystallinity in comparison to the method where crystallization is simultaneously conducted can be obtained because the dopant is added after conducting crystallization.

Embodiment 5

In the present embodiment, a method where gettering is also conducted simultaneously in the step of conducting crystallization using Ni will be described using FIG. 3.

First, in accordance with Embodiment 2, base insulating films 501*a* and 501*b* and an amorphous semiconductor layer 503 are formed on the substrate 500. However, in the present embodiment, the thickness of the semiconductor layer 504 is 55 to 140 nm (preferably, 60 to 120 nm).

Next, in accordance with Embodiment 4, a liquid 504 including Ni is applied to form a liquid layer 505 including Ni, and crystallization is conducted to turn the amorphous semiconductor layer 503 into a crystalline semiconductor layer 506. At this point in time, a high concentration of Ni remains in the crystalline semiconductor layer 506. The concentration distribution thereof is also shown in the graph attached to FIG. 3(D).

Figure 3A:
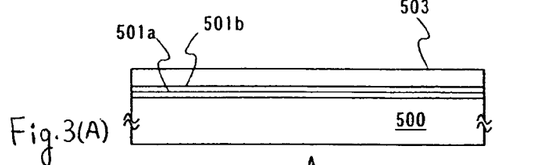
FIG. 3 are diagrams showing an example of an implementation of the invention.
Figures 3B, 3C:
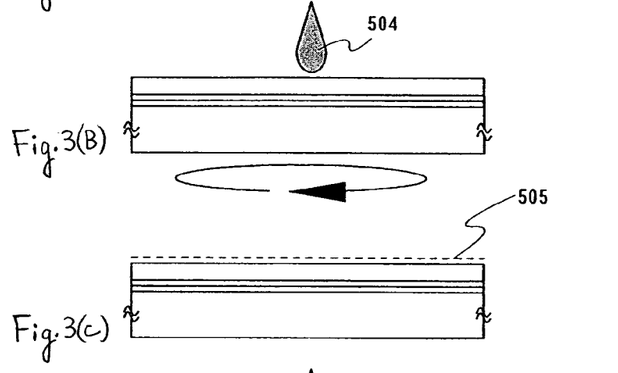
Figure 3D:
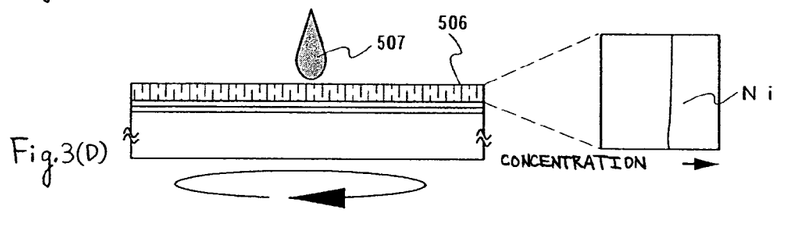
Figure 3E:
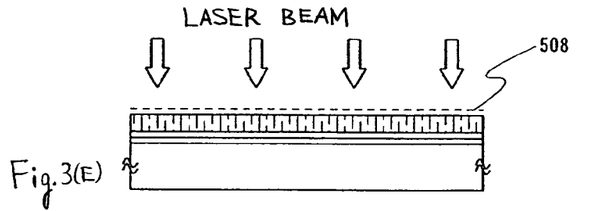
Figure 3F:
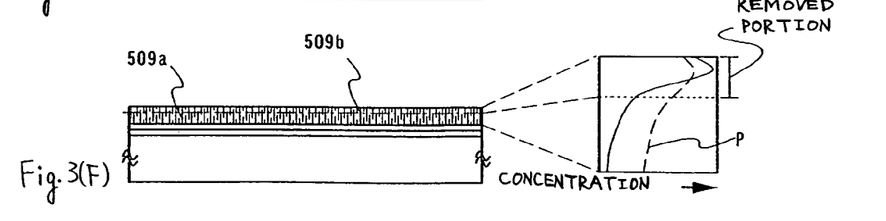
Figure 3G:
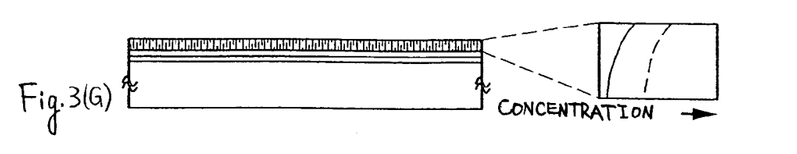

Next, a liquid 507 including phosphor (representatively, a phosphoric acid aqueous solution) is applied using a spinner (FIG. 3(D)) to form a thin film 508 of the liquid including phosphor on the surface of the semiconductor layer. Similar to Embodiment 2, the substrate in this state is irradiated with laser light (FIG. 3(E)).

As a result, the semiconductor layer becomes molten and the phosphor is incorporated therein, but. At this time, because recrystallization of the semiconductor begins from the substrate side, the concentration of the phosphor becomes higher, closer towards the surface of the semiconductor layer. Here, the concentration of the Ni also becomes larger closer towards the surface of the semiconductor layer because the solid solubility of the Ni becomes greater as the concentration of the impurity such as phosphor becomes higher, so that a region 509*b* where the concentrations of both the phosphor and the nickel are high is formed on the semiconductor layer surface (FIG. 3(F)).

About 30 to 60 nm of this region 509*b* where the concentrations of phosphor and the nickel are both high is removed by etching, whereby gettering is completed. The concentration of phosphor in the liquid including the phosphor in this case may be adjusted so that a desired concentration of the phosphor is incorporated in a portion 509*a* that is not removed by the gettering step. CMP may also be used instead of etching.

By using the present invention, it becomes possible to conduct gettering of the element that promotes crystallization simply by adding, to the laser doping step of the present invention, an etching or CMP step for removing the surface layer portion of the semiconductor, which leads to a significant reduction of steps.

It is also possible to use the present embodiment in combination with Embodiment 2.

Embodiment 6

In the present embodiment, a method of forming a shallow pn junction that controls the doping depth and suppresses the short channel effect using laser doping will be described.

In laser doping, because the dopant is incorporated by irradiating the semiconductor layer with laser light so that the semiconductor layer melts, the dopant is added only to the melted portion. Also, because there are many cases where the activity of the layer to which the dopant has been added by laser doping is high and annealing for activation is not necessary thereafter, there is no danger of diffusion due to annealing after the doping step.

When the dopant is added by laser doping, the things that affect the depth to which the semiconductor film melts are irradiation strength, irradiation time and wavelength. If the semiconductor film is irradiated with laser light for the same amounts of time and with the same wavelengths, the semiconductor film melts as far as a deep place if the irradiation strength is high and only melts as far as a shallow place if the irradiation strength is low. With respect to irradiation time, the depth to which the semiconductor film melts becomes deep because a large amount of energy is applied to one place if the irradiation time is long. With respect to wavelength, the wavelength affects the melting depth because the absorption coefficient of the laser light with respect to the semiconductor film differs depending on the wavelength.

In a case where silicon is irradiated with an XeCl excimer laser with a wavelength of 308 nm, the depth to which the laser light is directly absorbed by the silicon is about 30 nm because the absorption coefficient of the silicon in the vicinity of 300 nm is high. A position deeper than this gradually melts due to heat generated by the laser light absorbed as far as 30 nm.

In a case where the second higher harmonic wave of an Nd:YAG laser with a wavelength of 532 nm is used, which is often used, the absorption coefficient of the silicon in the vicinity of this wavelength is small and the laser light penetrates as far as the deep portion of the semiconductor layer. Forth is reason, in light of the fact that it is difficult to control the depth with this wavelength, a laser with a long wavelength such as a YAG laser may be converted to a third higher harmonic wave using a nonlinear optical element and converted to a laser of a wavelength in the ultra violet region where the absorption coefficient of the semiconductor layer is large.

In the present embodiment, the fundamental wave of an excimer laser is used and laser doping is conducted with an energy density of 300 mJ/cm$^2$ so that a region shallowly doped to about 40 nm from the semiconductor layer surface can be formed. In the present embodiment, a solid-state laser using a crystal such as YAG, YVO$_4$, YLF or YAlO$_3$ doped with Cr$^{3+}$, Cr$^{4+}$, Nd$^{3+}$, Er$^{3+}$, Ce$^{3+}$, Co$^{2+}$, Ti$^{3+}$, Yb$^{3+}$ or V$^{3+}$ can also be used. These lasers can be used in the present embodiment by converting the fundamental wavelength to a high-order higher harmonic wave in the ultra violet region using a nonlinear optical element.

The present embodiment can be suitably used to add an impurity to the source region and the drain region. In particular, by forming a shallow junction using the method of the present embodiment, it becomes possible to control the short channel effect, which results from channel regions that have become shorter in accordance with increasingly restrictive design rules.

The present embodiment can also be used in combination with Embodiments 1 to 5.

Embodiment 7

A method of fabricating a TFT using the present invention will be described using FIG. 4. As described in Embodiment 2, base insulating films 301*a* and 301*b* and a crystalline semiconductor film are formed on a substrate 300, and the crystalline semiconductor film is etched to form crystalline semiconductor films 302 to 305 of desired shapes. Crystallization may also be conducted after the semiconductor layer is etched to a desired shape and made into an amorphous semiconductor layer. Also, gettering of the nickel used for crystallization may also be conducted. When gettering is conducted with the method described in Embodiment 5, it can be conducted simply by adding etching or CMP to the channel doping step, which leads to a reduction of steps. Of course, gettering may also be conducted using another known method.

When gettering is conducted with another method, there is, for example, the following method. The surface is treated with ozone water to form a barrier film of about 1 to 5 nm, and then a gettering site is formed on the barrier film by sputtering. The gettering site is formed by depositing an amorphous silicon film including argon to a film thickness of 150 nm. The film forming conditions are as follows: the film forming pressure is 0.3 Pa; the gas (Ar) flow rate is 50 (sccm); the film forming power is 3 kW; and the substrate temperature is 150° C. The atom concentration of argon included in the amorphous silicon film under these conditions is $3\times10^{20}/cm^3$ to $6\times10^{20}/cm^3$, and the atom concentration of oxygen is about $1\times10^{19}/cm^3$ to $3\times10^{19}/cm^3$. Thereafter, heating is conducted for 3 minutes at 650° C. using a lamp annealing device and gettering is conducted. The gettering region may be removed by etching.

Next, a gate insulating film 306 is formed. The film thickness is 115 nm, and an insulating film including silicon may be formed by low pressure CVD, plasma CVD or sputtering.

In the present embodiment, a silicon oxide film is used with a thickness of 10 nm. In this case, the film can be formed by mixing TEOS (Tetraethyl Ortho Silicate) and $O_2$ by plasma CVD and discharging the mixture at a high frequency wave (13.56 MHz) power density of 0.5 to 0.8 $W/cm^2$ under the conditions of the reaction pressure being 40 Pa and the substrate temperature being 300 to 400° C. Excellent characteristics can be obtained by thereafter heating the silicon oxide film made in this manner at 400 to 500° C. to form the gate insulating Next, a first conductive film with a film thickness of 20 to 100 nm is formed on the gate insulating film, and a second conductive film with a film thickness of 100 to 400 nm is formed on the first conductive film. In the present embodiment, TaN was formed at a film thickness of 30 nm for the first conductive film, and W was formed at film thickness of 370 nm for the second conductive film. Both the TaN film and the W film may be formed by sputtering. The TaN film may be formed in a nitrogen atmosphere using a Ta target, and the W film may be formed using a W target. In order to use the first and second conductive films as gate electrodes, it is necessary for their resistance to be low. In particular, it is preferable to use a high-purity (99.9999%) target for the W target because it is preferable for the resistance of the W film to be 20 $\mu\Omega$ cm or less, and attention must also be paid to the mixing of impurities at the time of film formation. It is possible to make the resistance of the W film formed in this manner 9 to 20 $\mu\Omega$ cm.

Although TaN was used for the first conductive layer and W was used for the second conductive layer in the present embodiment, the invention is not limited thereto. Both the first conductive layer and the second conductive layer may also be formed by an element selected from Ta, W, Ti, Mo, Al, Cu, Cr and Nd, by an alloy material having element as a main component, or by a compound material. Also, a semiconductor film represented by a polysilicon film doped with an impurity element such as phosphor may be used. Also, an AgPdCu alloy may be used. Moreover, combinations of these may be appropriately selected. Also, although the conductive layers have a two-layer laminate structure in the present embodiment, they may also be just one layer or have a laminate structure of three or more layers.

Next, because the conductive layers are etched to form electrodes and wiring, a mask comprising a resist is formed by photolithography after an exposure step, and etching is conducted.

In a first etching, etching is conducted under first etching conditions and second etching conditions. The conductive layers are etched using the mask comprising the resist to form gate electrodes and wiring. The etching conditions may be appropriately selected.

In the method of the present embodiment, ICP (Inductively Coupled Plasma) etching is used. For the first etching conditions, $CF_4$, $Cl_2$ and $O_2$ are used for the etching gas, the gas flow ratio of each are 25/25/10 (sccm), and 500 W of RF (13.56 MHz) electric power is charged to a coil type electrode at a pressure of 1.0 Pa to generate plasma and conduct etching. 150 W of RF (13.56 MHz) electric power is also charged to the substrate side (sample stage) and a negative self-bias voltage is substantially applied. Due to these first etching conditions, the W film is etched to give the end portions of the first conductive film a tapered shape. The etching speed with respect to the W film under the first etching conditions is 200.39 nm/min, the etching speed with respect to the TaN film is 80.32 nm/min, and the selection ratio of W with respect to TaN is about 2.5. Also, the tapered angle of the W film is about 26° due to the first etching conditions.

Next, etching is conducted moving to the second etching conditions. The mask comprising the resist is not removed but left remaining, $CF_4$ and $Cl_2$ are used for the etching gas, the gas flow ratio of each are 30/30 (sccm), and 500 W of RF (13.56 MHz) electric power is charged to the coil type electrode at a pressure of 1.0 Pa to generate plasma and conduct etching for about 15 seconds. 20 W of RF (13.56 MHz) power is also delivered to the substrate side (sample stage) and a negative self-bias voltage is substantially applied. Under the second etching conditions where $CF_4$ and $Cl_2$ are mixed, both the W film and the TaN film are equally etched. In the first etching, the gate insulating film not covered by an electrode is etched to about 20 nm to 50 nm.

In the first etching, the end portions of the first conductive film and the second conductive film become a tapered shape due to the effect of the bias voltage applied to the substrate side. In this manner, in the first etching, conductive layers of a first shape comprising the first conductive layer and the second conductive layer are formed.

Next, the second etching is conducted without removing the mask comprising the resist. In the second etching, $SF_6$, $Cl_2$ and $O_2$ are used for the etching gas, the gas flow ratio of each are 24/12/24 (sccm), and 700 W of RF (13.56 MHz) electric power is charged to the coil side power at a pressure of 1.3 Pa to generate plasma and conduct etching for about 25 seconds. 10 W of RF (13.56 MHz) power is also delivered to the substrate side (sample stage) and a negative self-bias voltage is substantially applied. Under these etching conditions, the W film is selectively etched so that conductive films 307a to 310a and 307b to 310b of a second shape are formed.

Then, first doping is conducted without removing the mask comprising the resist. Thus, an impurity creating an N-type is added at a low concentration to the crystalline semiconductor layers 302 to 305. The first doping may be conducted by ion doping or ion implantation. The ion doping may be conducted with the conditions that the dose amount is $1\times10^{13}$ to $5\times10^{14}$ atoms/cm$^2$ and the acceleration voltage is 40 to 80 kV. In the present embodiment, doping was conducted with an acceleration voltage of 50 kV. An element belonging to Group 15 can be used as the impurity element creating the N-type, and representatively, phosphor (P) or arsenic (As) is used. In the present embodiment, phosphor (P) was used. In this case, the first conductive layers 307a to 310a are used as a mask to form a first impurity region (N$^{--}$ region) to which a low concentration of the impurity is self-aligningly added.

Next, the mask comprising the resist is removed. Then, a new mask comprising a resist is formed to cover a place forming a low-concentration impurity region of the semiconductor layer 304 and the semiconductor layers 303 and 305 creating a P-channel TFT, and the second doping is conducted with an acceleration voltage higher than that of the first doping. The second doping also adds an impurity that creates the N-type. The conditions of ion doping are such that the dose amount is $1\times10^{13}$ to $3\times10^{15}$ atoms/cm$^2$ and the acceleration voltage is 60 to 120 kV. In the present embodiment, doping was conducted with a dose amount of $3.0\times10^{15}$ atoms/cm$^2$ and an acceleration voltage of 65 kV. The second doping is conducted using the second conductive layers as a mask with respect to the impurity element so that the impurity element is added to the semiconductor layers positioned underneath the first conductive layers.

When the second doping is conducted, a second impurity region (N$^-$ region, Lov region) 311 is formed at the portion not overlapping the second conductive layers 307b to 310b of the portion overlapping the first conductive layers 307a to 310a of the crystalline semiconductor layers 302 to 305, or at the portion not covered with the mask. The impurity creating the N-type is added to the second impurity region 311 in a concentration range of $1\times10^{18}$ to $5\times10^{19}$ atoms/cm$^3$. The impurity creating the N-type is also added in a high concentration in the range of $1\times10^{19}$ to $5\times10^{21}$ atoms/cm$^3$ to exposed portions (third impurity region: N$^+$ region) 312 and 313 not covered by the conductive layers 307a to 310a of the first shape of the crystalline semiconductor layers 302 to 305. Also, although an N$^+$ region remains on the semiconductor layer 304, there is a portion 314 partially covered only by the mask. The concentration of the impurity creating the N-type at this portion is the same as the concentration of the impurity added by the first doping.

Although the respective impurity regions are formed by the two doping processes in the present embodiment, the invention is not limited thereto. Conditions may be appropriately set to form impurity regions having desired impurity concentrations by doping the semiconductor one time or several times.

Next, after the mask comprising the resist is removed, a new mask comprising a resist is formed on the semiconductor layers 302 and 304 forming an N-channel TFT and third doping is conducted. Due to this third doping, fourth impurity regions (P$^+$ regions) 315 and 316 and fifth impurity regions (P$^-$ regions) 317 and 318, to which are added impurity elements creating a conductive type that is opposite from that of the first conductive type and the second conductive type, are formed on the semiconductor layer serving as a P-channel TFT.

In the third doping, the fourth impurity regions (P$^+$ regions) are formed on the portions 315 and 316 that are not covered by the mask comprising the resist and do not overlap with the first conductive layers, and the fifth impurity regions (P$^-$ regions) are formed on the portions 317 and 318 that are not covered by the mask comprising the resist, that overlap with the first conductive layers and do not overlap with the second conductive layers. Elements belonging to Group 13 of the Period Table, such as boron (B), aluminium (Al) and gallium (Ga), are known as impurity elements that create the P-type.

In the present embodiment, boron (B) was selected as the P-type impurity element forming the fourth impurity regions and the fifth impurity regions and was formed by ion doping using diborane (B$_2$H$_6$). For the ion doping conditions, the dose amount was $1\times10^{16}$ atoms/cm$^2$ and the acceleration pressure was 80 kV.

Here, phosphor is added at respectively different concentrations to the fourth impurity regions (P$^+$ regions) 315 and 316 and the fifth impurity regions (P$^-$ regions) 317 and 318 by the first and second doping processes. However, all the fourth impurity regions (P$^+$ regions) 315 and 316 and the fifth impurity regions (P$^-$ regions) 317 and 318 are doped by the third doping so that the concentration of the impurity element creating the P-type becomes $1\times10^{19}$ to $5\times10^{21}$ atoms/cm$^2$. For this reason, the fourth impurity regions (P$^+$ regions) 315 and 316 and the fifth impurity regions (P$^-$ regions) 317 and 318 function without problem as the source regions and the drain regions of the P-channel TFT.

In the present embodiment, the fourth impurity regions (P$^+$ regions) 315 and 316 and the fifth impurity regions (P$^-$ regions) 317 and 318 were formed by one-time third doping, but the invention is not limited thereto. Depending on the doping conditions, the fourth impurity regions (P$^+$ regions) 315 and 316 and the fifth impurity regions (P$^-$ regions) 317 and 318 may also be appropriately formed by plural dopings.

Next, the mask comprising the resist is removed and a first passivation film 319 is formed. As the passivation film, an insulating film including silicon is formed to a thickness of 100 to 200 nm. The film may be formed using plasma CVD or sputtering. In the present embodiment, a silicon oxide nitride film with a film thickness of 100 nm was formed by plasma CVD. When a silicon oxide nitride film is used, a silicon oxide nitride film made from SiH$_4$, N$_2$O and NH$_3$ or a silicon oxide nitride film made from SiH$_4$ and N$_2$O may be formed by plasma CVD. The fabrication conditions in this case are such that the reaction pressure is 20 to 200 Pa, the substrate temperature is 300 to 400° C., and the high-frequency (60 MHz) power density is 0.1 to 1.0 W/cm$^2$. Also, a silicon oxide nitride hydride film made from SiH$_4$, N$_2$O and H$_2$ may be used as the first passivation film 319. Of course, the first passivation film 319 is not limited to the single layer structure of the silicon oxide nitride of the present embodiment. An other insulating film including silicon may be used as a single layer structure or laminate structure.

Thereafter, heating process (thermal treatment) is conducted, and recovery of the crystallinity of the semiconductor layer and activation of the impurity element added to the semiconductor layer are conducted. The heating may be conducted at 400 to 700° C. in a nitrogen atmosphere whose oxygen concentration is 1 ppm or less and preferably 0.1 ppm or less. In the present embodiment, activation was conducted by heating at 410° C. for 1 hour. Besides heating, laser annealing or rapid thermal annealing (RTA) can be used.

Hydrogenation of the semiconductor layer can also be conducted at the same time as activation by conducting heating after the first passivation film 319 is formed. The hydrogenation terminates the dangling bonds of the semiconductor layer with the hydrogen included in the first passivation film 319.

Heating may be conducted before the first passivation film 319 is formed. However, in a case where the material configuring the first conductive layers and the second conductive layers is sensitive to heat, it is preferable to conduct heating after the first passivation film 319 is formed, as in the present embodiment, in order to protect the wiring. Moreover, because there is no passivation film 319 in this case, hydrogenation using the hydrogen included in the passivation film naturally cannot be conducted.

In this case, hydrogenation using means using hydrogen excited by plasma (plasma hydrogenation) or hydrogenation by heating for 1 to 12 hours at 300 to 450° C. in an atmosphere including 3 to 100% hydrogen may be used.

Next, a first inter layer insulating film 320 is formed on the first passivation film 319. An inorganic insulating film or an organic insulating film can be used as the first inter layer insulating film 320. A silicon oxide film formed by CVD or a silicon oxide film applied by SOG (Spin On Glass) can be used as the inorganic insulating film, and a film such as polyimide, polyamide, BCB (benzocyclobutene), acrylic, or a positive-type photosensitive organic film or a negative-type photosensitive organic film can be used as the organic insulating film. A laminate structure of an acrylic film and a silicon oxide nitride film may also be used.

In the present embodiment, a non-photosensitive acrylic film with a film thickness of 1.6 μm was formed. Unevenness resulting from the TFT can be alleviated and flattened by the first inter layer insulating film 320. In particular, because the flattening implication of the first inter layer insulating film 320 is strong, it is preferable to use an insulating film of a material that is easy to flatten.

Thereafter, a second passivation film 321 comprising a silicon nitride oxide film is formed on the first inter layer insulating film 320. The second passivation film 321 may be formed with a film thickness of 10 to 200 nm. With the second passivation film, moisture can be prevented from entering and leaving the first inter layer insulating film 320. Also, a silicon nitride film, an aluminium nitride film, an aluminium oxide nitride film, a diamond like carbon (DLC) film or a carbon nitride (CN) film can be similarly used for the second passivation film.

Also, a film formed using RF sputtering has a high fineness and excellent barrier-ability. In a case where, for example, a silicon oxide nitride film is formed, the film is formed with an Si target, with the RF sputtering conditions being such that $N_2$, Ar and $N_2O$ flow so that the gas flow ratio become 31:5:4, with the pressure being 0.4 Pa and the electric power being 3000 W. In a case where, for example, a silicon nitride film is formed, the film is formed with an Si target, with the RF sputtering conditions being such that $N_2$ and Ar in the chamber flow so that the gas flow rates become 20:20, with the pressure being 0.8 Pa, the electric power being 3000 W and the film forming temperature being 215° C. In the present embodiment, a silicon oxide nitride film is formed as the second passivation film 321 with a film thickness of 70 nm using RF sputtering.

Next, the second passivation film 321, the first inter layer insulating film 320 and the first passivation film 319 are etched by etching to form contact holes that reach the third impurity regions 312 and 313 and the fourth impurity regions 315 and 316.

Next, wirings 322 to 328 and an electrode 329 that are electrically connected to the impurity regions are formed. These wirings are formed by patterning a laminate film of a Ti film with a film thickness of 50 nm and an alloy film (Al and Ti) with a film thickness of 500 nm. Of course, the wirings are not limited to a two-layer structure and may have a single-layer structure or a laminate structure of three or more layers. Also, the wiring material is not limited to Al and Ti. For example, the wirings may be formed by forming an Al film or a Cu film on a TaN film and the laminate film forming the Ti film may be patterned.

Figure 4:
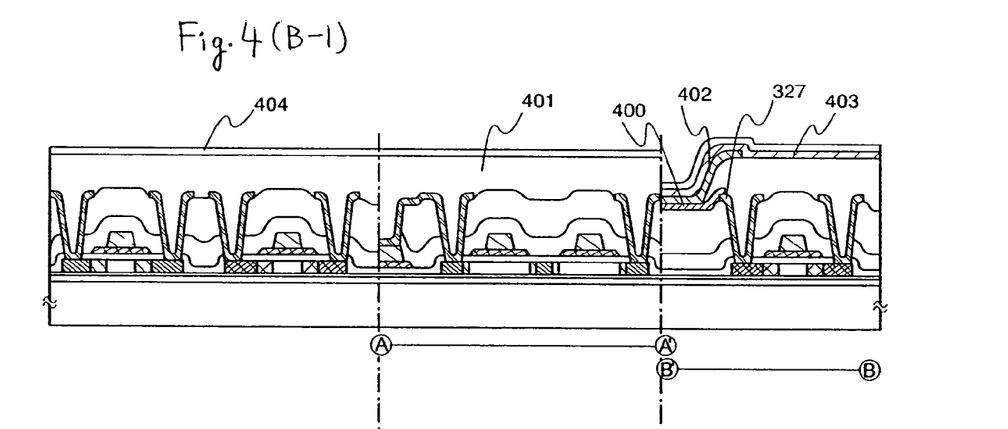
FIG. 4 are diagrams showing an example of an implementation of the invention.
Figure 4A:
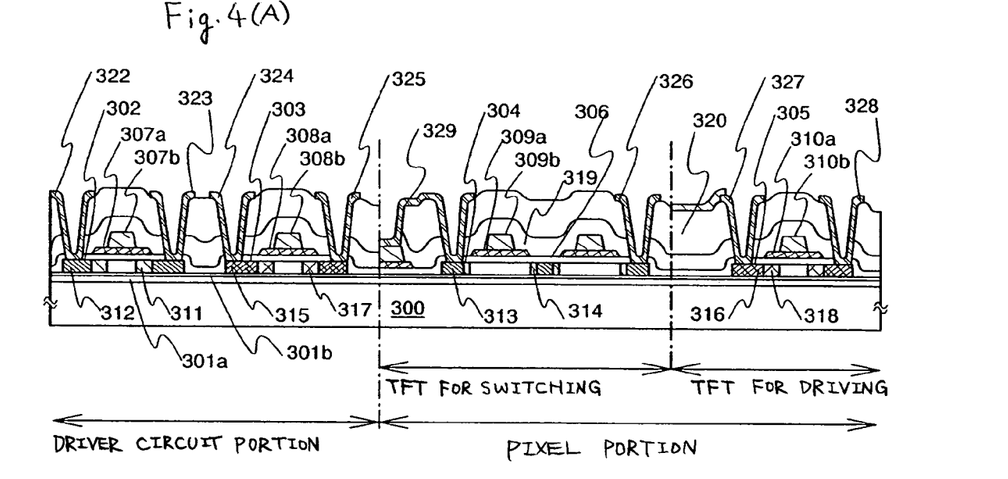

In this manner, with the present invention, the form of FIG. 4 can be obtained, and channel doping, where precise concentration control is conducted even with respect to a large-area substrate, can be easily done by adding a dopant to the semiconductor layer by laser irradiation after the dopant is applied with the liquid. Moreover, by using the present invention, a TFT, in which precise control of the threshold voltage is conducted, can be fabricated.

The present embodiment can be appropriately combined with Embodiments 1 to 6 or replaced and used.

Embodiment 8

Figure 5:
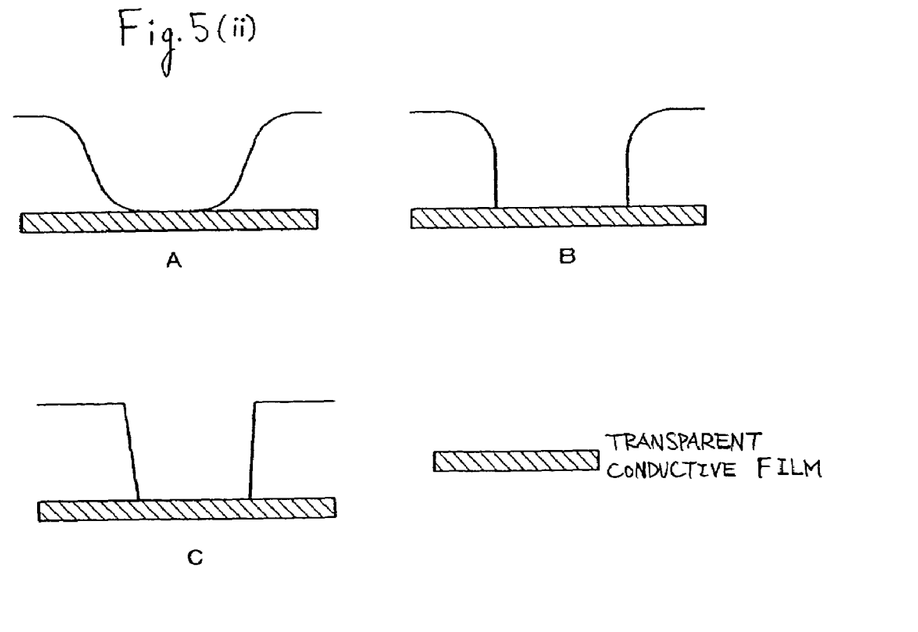
FIG. 5 are diagrams showing an example of an implementation of the invention.
Figure 5I:
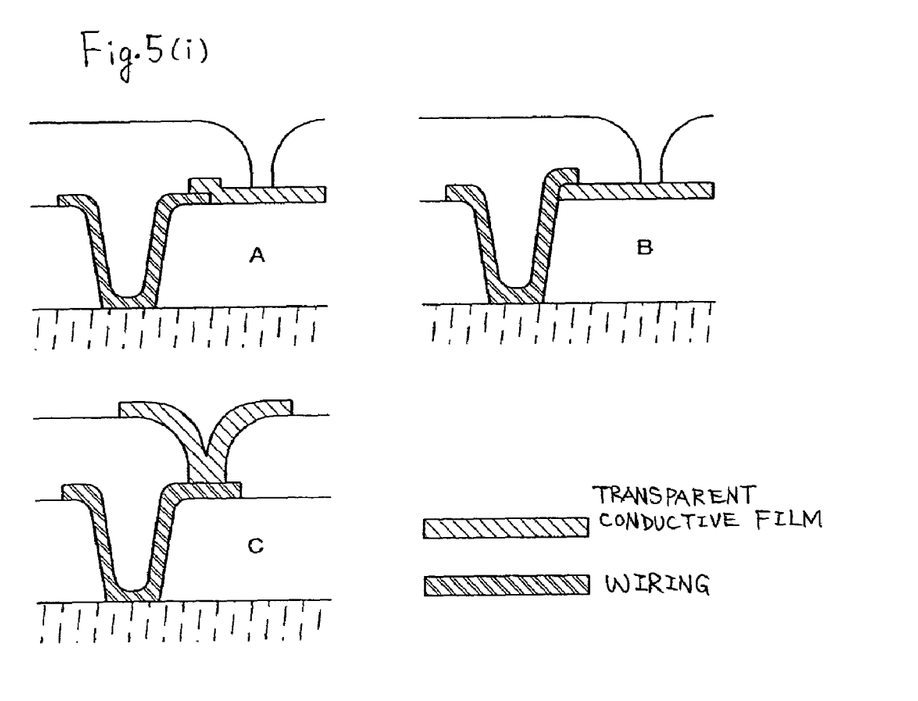

In the present embodiment, an example where a display device is manufactured using the TFT fabricated using the present invention will be described using FIG. 4 and FIG. 5.

After the TFT of the invention shown in FIG. 4 is fabricated, a first electrode 400 comprising a transparent conductive film is formed so as to partially overlap a wiring 327 of the TFT. It is preferable to use a material having a large work function as the transparent conductive film. A compound of indium oxide and tin oxide (ITO), a compound of indium oxide and zinc oxide, zinc oxide, tin oxide, indium oxide and titanium nitride can be used. When an ITO film or a film made by adding gallium to the transparent conductive film is made by sputtering, a film made by mixing $SiO_2$ with the target may also be used. This first electrode 400 serves as an anode of a light-emitting element. In the present embodiment, ITO is used for the first electrode 400. The ITO is formed by sputtering to a thickness of 0.1 ⌈m.

As shown in FIG. 5(i), in addition to the method where the transparent conductive film is formed after the TFT wiring 327 is formed, as is described in the present embodiment, the transparent conductive film may also be formed by a method where it is formed before the wiring 327 is formed (FIG. 5(i)B) or by a method where it is formed by opening a contact hole after an insulator is formed (FIG. 5(i)C) after the TFT wiring 327 is formed. FIG. 5(i)A shows the form in the method of the present embodiment.

Next, an insulator 401 is formed so as to cover the end surfaces of the electrode. The insulator 401 can be formed with an inorganic or an organic material, but is preferably formed using a photosensitive organic material because it is difficult for gaps to occur when the shape of the open portion deposits a light-emitting layer. For example, in a case where a negative-type photosensitive acrylic is used as the material for the insulator 401, it can be formed so that it has a curved surface having a first radius of curvature at the upper end portion of the insulator 401 and has a curved surface having a second radius of curvature at the lower end portion of the insulator, as shown in FIG. 5(ii)A. It is preferable for the first radius of curvature and the second radius of curvature to be 0.2 μm to 3 μm and for the angle of the wall surface of the open portion with respect to the ITO to be 35° or more. Also, the photosensitivity is not limited to a negative type, but a positive type can be used. In this case, the shape of the open portion when the positive type is used is such that, as shown in FIG. 5(ii)B, the upper end portions of the insulator are curved surfaces having a radius of curvature. In a case where it is made by etching the open portion of the insulator 401 without using a photosensitive organic material, it has the shape shown in FIG. 5(ii)C.

Thereafter, it is wiped using a PVA (polyvinyl alcohol) porous body to remove dust. In the present embodiment, particles (dust) generated when the ITO and insulating film were etched are removed by wiping using a PVA porous body.

Next, PEDOT is coated on the entirety and baking is conducted in a light-emitting layer deposition pretreatment. In this case, because the wettability between the PEDOT and the ITO is not good, it is preferable to first apply the PEDOT, wash it with water, and then apply the PEDOT again. Thereafter, heating is conducted at atmospheric pressure to extract the water, and then heating is conducted in a low-pressure atmosphere. In the present embodiment, heating is conducted for 4 hours in a low-pressure atmosphere of 170° C. after applying the PEDOT, and then natural cooling is conducted for 30 minutes.

Then, using a deposition device, deposition is conducted while moving the deposition source. For example, deposition is conducted in a film-forming chamber evacuated so that the degree of vacuum is $5 \times 10^{-3}$ Torr (0.665 Pa) or less, and preferably $10^{-4}$ to $10^{-6}$ Torr. At the time of deposition, the organic compound is vaporized in advance by resistance heating so that it is dispersed in the direction of the substrate due to the shutter opening at the time of deposition. The vaporized organic compound is dispersed upwards, passes through an open portion disposed in a metal mask and is deposited on the substrate, whereby a light-emitting layer 402 (including a hole transport layer, a hole injection layer, an electron transport layer and an electron injection layer) is formed.

Here, an example is described where the light-emitting layer 402 is formed by deposition, but the invention is not particularly limited thereto. A light-emitting layer comprising a polymer may also be formed by coating (spin-coating, ink jetting and the like.). Also, in the present embodiment, an example is described where a layer comprising a low-molecular weight material was laminated as the organic compound layer, but a layer comprising a polymer material and a layer comprising a low-molecular weight material may also be laminated. Also, even if light-emitting layers of RBG are formed to conduct full-color display, a light-emitting layer of a single color may be formed so that full-color display is conducted using a color conversion layer and a color filter. An inorganic material may also be used.

The light-emitting mechanism of a light-emitting element is said to be such that a voltage is applied between a pair of electrodes having sandwiched there between an organic compound layer, whereby electrons injected from the cathode and holes injected from the anode bond again at the light-emitting center in the organic compound layer to form molecular excitons, and the molecular excitons release energy when they return to the ground state so that the light-emitting element emits light. Singlet excitation and triplet excitation are known among excitation states, and it is thought that light emission is possible via both excitation states.

A light-emitting layer ordinarily has a laminate structure, and the configuration "hole transport layer/electroluminescence layer/electron transport layer" is representative of this laminate structure. Because the luminous efficiency of this structure is extremely high, this structure is used in almost all light-emitting devices, with respect to which advances are presently being made in research and development. In addition, structures where a hole injection layer/a hole transport layer/an electroluminescence layer/an electron transport layer, or where a hole injection layer/a hole transport layer/an electroluminescence layer/an electron transport layer/an electron injection layer, are laminated in this order on an anode are also fine. The electroluminescence layer may also be doped with a fluorescent dye.

In the present specification, all layers disposed between the cathode and the anode will be collectively referred to as the light-emitting layer. Thus, the aforementioned hole injection layer, the hole transport layer, the electroluminescence layer, the electron transport layer and the electron injection layer are all included in the light-emitting layer. It is possible to form these using a low-molecular weight organic compound material, an intermediate molecular weight organic compound material or a high-molecular weight organic compound material, or by appropriately combining both. Also, a mixed layer in which an electron-transporting material and a positive-hole transporting material are appropriately mixed or a mixed junction forming a mixed region on their respective junction boundary face may be formed. In addition to an organic material, an inorganic light-emitting material may also be used.

Next, a second electrode 403 is formed as a cathode on the light-emitting layer 402. The second electrode 403 may be formed using a thin film including a metal (Li, Mg, Cs) having a small work function. Moreover, it is preferable to form the second electrode 403 with a laminate film of a transparent conductive film (ITO (alloy of indium oxide and tin oxide), alloy of indium oxide zinc oxide ($IN_2O_3$—ZnO), zinc oxide (ZnO), etc.) laminated on the thin film including Li, Mg and Cs. The film thickness may be appropriately set so that the second electrode 403 acts as a cathode, but is preferably formed by electron beam deposition to a thickness of about 0.01 to 1 µm.

Here, when electron beam deposition is used, radiation is generated and the TFT is damaged if the acceleration voltage is too high. However, because the film forming speed drops and productivity is reduced even if the acceleration voltage is too low, as a countermeasure, care should be taken so that the second electrode 403 is not excessively formed to more than the thickness where the second electrode 403 can act as a cathode. If the cathode is thin, not much affect on productivity appears even if the film forming speed is slow. In this case, the problem arises that the second electrode becomes highly resistant due to the film thickness of the cathode being thin, but this can be solved by forming Al, which is a low-resistance metal, on the cathode by low-resistance heat deposition or sputtering to form a laminate structure.

Next, a third passivation film 404 is formed on the insulator 401 and the second electrode 403. The second passivation film 321 and the third passivation film 404 both use a film through which it is difficult for substances such as water and oxygen, which accelerate the deterioration of the light-emitting element, to be transmitted in comparison to other insulating films. Representatively, it is preferable to use, for example, a DLC film, a carbon nitride film or a silicon nitride film formed by RF sputtering. It is also preferable for the film thickness thereof to be 10 to 200 nm.

In this manner, the light-emitting element shown in FIG. 4(B-1) can be obtained. Although not illustrated, a plastic film is disposed thereon as a sealing material and the space there between is filled with an inactive gas. Then, by connecting it to an external terminal with an FPC (Flexible Printed Circuit) using an anisotropic conductive film, the light-emitting display device (display module) is completed.

In the present embodiment, although an example was described where light is emitted from the substrate side (bottom), a laminate structure is made as shown in FIG. 4(B-2) in order to emit the light from the top. In this case, the second electrode may be formed by a translucent material.

By manufacturing a display device using a TFT where the threshold voltage is precisely controlled using the present invention, a display device where there are less variations in the luminance of the light-emitting element and which can provide higher-quality images can be made.

The present embodiment can be appropriately combined with Embodiments 1 to 7 or replaced and used.

According to the present invention, channel doping, where concentration control is extremely important in order to control the threshold voltage, can be precisely and efficiently administered over a large area. Also, by appropriately selecting the laser and the energy thereof, it becomes possible to selectively conduct doping just at the extremely shallow portion of the surface of the semiconductor layer. Moreover, because the crystalline structure is not destroyed by doping, labor for activation, which is necessary after conducting ion implantation and plasma doping, is not required, so that a reduction of steps and an improvement in yield can be expected.

Also, according to the present invention, it becomes possible to remove, without the addition of a substantial step, elements that have an adverse affect on the characteristics of a semiconductor, remain in the semiconductor and promote excessive crystallization, so that an improvement in throughput and an improvement in yield can be expected.

The invention claimed is:

1. A semiconductor device fabrication method including:
    applying a liquid including a dopant, which creates an N-type or a P-type, to an amorphous semiconductor layer formed on a substrate including an insulating surface; and
    crystallizing the amorphous semiconductor layer by irradiating the amorphous semiconductor layer with laser light to form a crystalline semiconductor layer, simultaneously incorporating the dopant into the crystalline semiconductor layer.

2. A semiconductor device fabrication method including:
    applying a liquid including a dopant and an element that promotes crystallization to an amorphous semiconductor layer formed on a substrate including an insulating surface; and
    crystallizing the amorphous semiconductor layer by irradiating the amorphous semiconductor layer with laser light to form a crystalline semiconductor layer, simultaneously incorporating the dopant into the crystalline semiconductor layer.

3. The semiconductor device fabrication method of claim 2, wherein after the dopant is incorporated, a surface layer portion of the crystalline semiconductor is removed.

4. The semiconductor device fabrication method of claim 3, wherein the thickness of the surface layer portion that is removed is 30 to 60 nm.

5. The semiconductor device fabrication method of claim 2, wherein the element that promotes crystallization is any one or several of nickel, iron, palladium, tin, lead, cobalt, platinum, copper and gold.

6. The semiconductor device fabrication method of claim 2, wherein the dopant creates an N-type or P-type in the crystalline semiconductor layer.

7. A semiconductor device fabrication method including:
    applying a liquid including an element that promotes crystallization to an amorphous semiconductor layer formed on a substrate including an insulating surface;
    crystallizing the amorphous semiconductor layer by heating the amorphous semiconductor layer to form a crystalline semiconductor film; applying a liquid including a dopant to the crystalline semiconductor layer; and
    incorporating the dopant into the crystalline semiconductor layer by irradiating the crystalline semiconductor layer with laser light.

8. The semiconductor device fabrication method of claim 7, wherein after the dopant is incorporated, a surface layer portion of the crystalline semiconductor is removed.

9. The semiconductor device fabrication method of claim 8, wherein the thickness of the surface layer portion that is removed is 30 to 60 nm.

10. The semiconductor device fabrication method of claim 7, wherein the element that promotes crystallization is any one or several of nickel, iron, palladium, tin, lead, cobalt, platinum, copper and gold.

11. The semiconductor device fabrication method of claim 7, wherein the dopant creates an N-type or P-type in the crystalline semiconductor layer.

* * * * *